United States Patent
Schwent et al.

(10) Patent No.: US 6,850,574 B2
(45) Date of Patent: Feb. 1, 2005

(54) MULTIPLE BANDWIDTH AMPLIFIER CONTROL SYSTEMS FOR MOBILE STATIONS AND METHODS THEREFOR

(75) Inventors: Dale G. Schwent, Schaumburg, IL (US); Alexander W. Hietala, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 787 days.

(21) Appl. No.: 09/854,858

(22) Filed: May 14, 2001

(65) Prior Publication Data

US 2002/0168025 A1 Nov. 14, 2002

(51) Int. Cl.$^7$ .............................................. H04L 25/03
(52) U.S. Cl. ...................................... 375/297; 455/126
(58) Field of Search ................................ 375/297, 296; 330/254, 278, 307, 291, 129; 327/563; 455/126, 115

(56) References Cited

U.S. PATENT DOCUMENTS

| | | | |
|---|---|---|---|
| 4,458,209 A | 7/1984 | Miller et al. | |
| 5,287,555 A | * 2/1994 | Wilson et al. | 455/115.1 |
| 5,416,441 A | 5/1995 | Nagano | |
| 5,566,363 A | 10/1996 | Senda | |
| 5,697,074 A | * 12/1997 | Makikallio et al. | 455/126 |
| 6,078,216 A | * 6/2000 | Proctor, Jr. | 330/151 |
| 6,295,442 B1 | * 9/2001 | Camp et al. | 455/102 |

* cited by examiner

Primary Examiner—Khai Tran
(74) Attorney, Agent, or Firm—Ronald K. Bowler, II

(57) ABSTRACT

RF amplifier control circuits for transmitters in mobile communication devices, combinations thereof and methods therefor. The control circuits include generally proportional and integral control circuits having an output coupled to a control input of an amplifier. An initial control signal is applied to the amplifier before a vector modulator output coupled an input thereof is at full output power. The vector modulator output is ramped to full output after applying the initial control signal. Thereafter, the initial control signal applied to the amplifier during ramping is corrected by integrating an output of the amplifier relative to a second reference signal with an integral control circuit coupled to the control input of the amplifier, the second reference signal is proportional to the ramping vector modulator output.

24 Claims, 7 Drawing Sheets

MULTIPLE BANDWIDTH AMPLIFIER CONTROL SYSTEMS FOR MOBILE STATIONS AND METHODS THEREFOR

FIELD OF THE INVENTIONS

The present inventions relate generally to control systems, and more particularly to control circuits for transmitters in mobile communication devices, combinations thereof and methods therefor.

BACKGROUND OF THE INVENTIONS

Power control systems are known generally. In analog control circuits, an amplifier output power is detected by a peak-detect circuit, which is coupled to an integrator. An output of the integrator controls the amplifier in a manner that tends to match the output of the peak-detect circuit with a reference signal to the integrator.

U.S. Pat. No. 4,458,209 entitled "Adaptive Power Control Circuit", assigned commonly with the present application, discloses a dual band analog control loop having an integrator with a variable response time provided by switching first and second resistors of an RC time constant. The faster time constant applies to transient operation and the slower time constant to steady-state operation. See also, U.S. Pat. No. 5,697,074 entitled "Dual Rate Power Control Loop For a Transmitter".

In digital control circuits, the peak detect circuit output is filtered and converted to a digital format before being input to a processor, which provides an output control signal based on a comparison of the digitized input signal with a reference signal. Like the analog control circuits discussed above, digital control circuits control the amplifier in a manner that tends to match the digitized peak-detect circuit signal with the reference signal. Digital processing however runs generally at a slower rate than the modulation rate of the peak-detect circuit signal so that variation of the envelope is tracked poorly or not tracked at all. Another limitation of known digital control circuits is that a D/A converter at the output of the processor is written initially with an estimated value, which requires knowledge of gain at the start of the transmit sequence for acceptable performance. The estimated value moreover is susceptible to variations in temperature, voltage, load and other conditions. U.S. Pat. No. 5,287,555 entitled "Power Control Circuitry for A TDMA Radio Frequency Transmitter", the subject matter of which is incorporated by reference herein.

The various aspects, features and advantages of the present invention will become more fully apparent to those having ordinary skill in the art upon careful consideration of the following Detailed Description of the Invention with the accompanying drawings described below.

DETAILED DESCRIPTION OF THE INVENTIONS

The present invention relates to control systems and circuits and methods therefore, which are suitable for implementation in mobile communication device transmitters, for example, in cellular telephone handsets, pagers, wireless enabled personal digital assistants and other wireless communication devices.

Figures 1, 2:
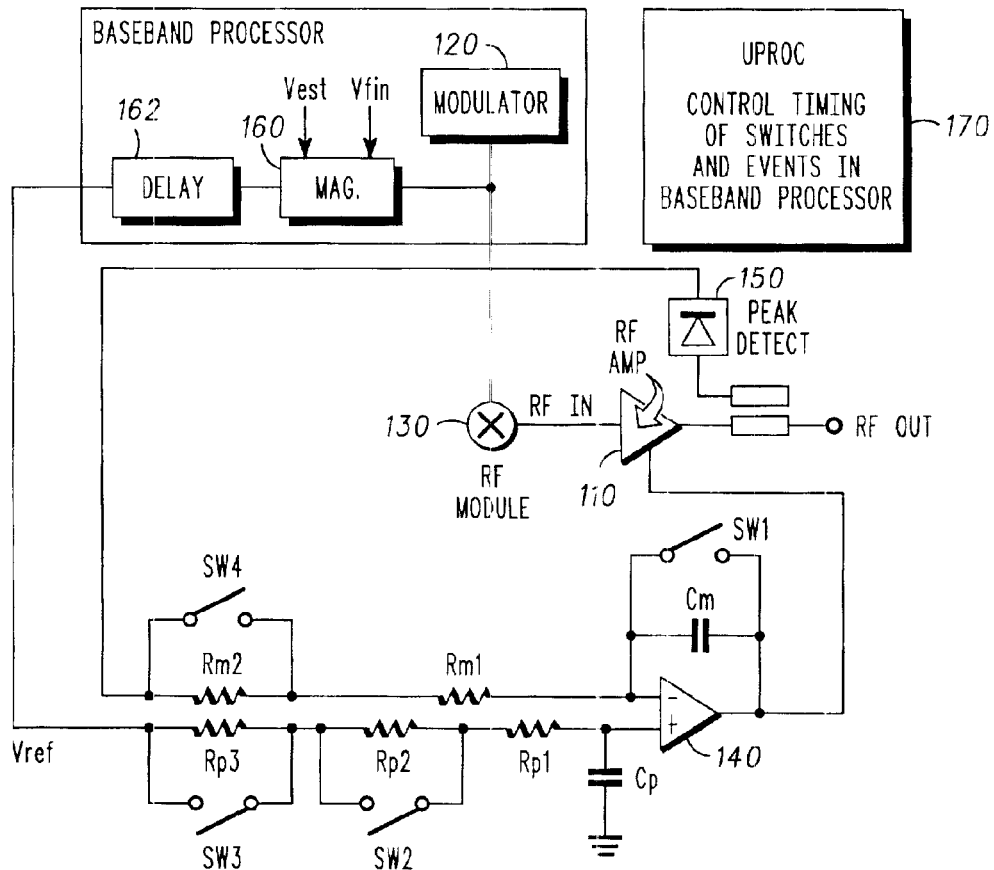
FIG. 1 is an analog implementation of a control circuit according to a first exemplary embodiment of the invention.
FIG. 2 is a look up table for storing estimation mode operation reference signals for different output power levels.

FIG. 1 is an exemplary RF amplifier and control circuit 100 comprising generally an amplifier 110 and a vector modulator 120 having an output coupled to an input of the amplifier by an RF modulator 130, which converts vector modulation from the modulator to the RF operating frequency of the amplifier. The amplifier 110 includes generally a control input and may comprise a chain or several stages as is known in the art.

The control circuit also comprises generally a proportional control circuit and an integral control circuit. In one embodiment, the proportional control circuit includes an input coupled to a first reference signal source and an output coupled to the control input of the amplifier. The integral control circuit integrates an output of the amplifier relative to a reference signal and includes an integrator control signal output coupled to the control input of the amplifier.

In the exemplary embodiment of FIG. 1, an op-amp 140 having an output coupled to the control input of the amplifier 110 is configurable as a unity gain buffer circuit and as an integrator circuit, which constitute the proportional and integral control circuits, respectively.

In FIG. 1, the output of the amplifier is coupled generally to an input of the op-amp 140, for example by a non-linear device. In FIG. 1, a peak-detect circuit 150 interconnects the amplifier output to the op-amp input.

In an initial mode of operation, referred to herein as the "Estimation Mode", the proportional control circuit applies an initial control signal to the control input of the amplifier by applying a first reference signal to the proportional gain control circuit.

During estimation mode, the reference signal applied to the proportional control circuit is an estimate of the value required at the integral control circuit output (or the control input of the amplifier) for the amplifier output to achieve its desired output power when the vector modulator is at its full output level. The actual power output during estimation is relatively low since the vector modulator output is low, as discussed below.

During estimation mode, the vector modulator 120 is not at full output and may or may not be active. Depending on the modulation format, the vector modulator output may be zero or may be vacillating between zero and low level outputs. This latter condition is common of a root raised cosine response vector modulator in the time before the modulator output ramps up to full power.

In one embodiment, estimation mode reference signal values for corresponding amplifier power outputs are preprogrammed and stored in memory, for example in a look-up table or in a Radio Logic Unit as illustrated in FIG. 2. In some applications, the estimation mode reference signal levels are also obtained for particular output power levels by sampling the output of the integral control circuit after a subsequent ramping mode of operation, discussed below.

In the exemplary embodiment of FIG. 1, the op-amp is configured as the unity gain buffer by closing switch SW1 so that the op-amp output will follow the reference signal applied to the positive input thereof. During estimation mode, in the exemplary embodiment of FIG. 1, switches SW2, SW3 and SW4 are also closed. In FIG. 1, a magnitude block 160 of a base band processor generates the estimation mode reference signal Vref equal to Vest, which is input to the op-amp gain circuit. In the exemplary embodiment of FIG. 1, the switches SW1, SW2, SW3 and SW4 and the baseband processor are controlled by a processor 170.

In one embodiment, there is a filter between the reference signal source and the input of the proportional control circuit to control the bandwidth of the signal change at the reference input of the proportional gain control circuit and to reduce transient out of band power during estimation.

In the exemplary embodiment of FIG. 1, the filter is at the positive input of the op-amp 140 and comprises resistor Rp1 and capacitance Cp. A typical RC time constant during Estimation Mode is Rp1*Cp=0.2Ts, where Ts is the "Symbol Time", which is the time between subsequent modulation symbols in a vector modulation system. This typical estimation mode RC time constant value is exemplary only and is not intended to limit the invention.

The estimation mode lasts generally for a sufficient time interval required for the proportional control circuit to reach steady state. In one embodiment, the estimation mode time period lasts for approximately 5 RC estimation mode time constants, although it may be more or less.

After estimation mode, the output of the vector modulator 120 is ramped upwardly to its full output power in ramping mode. Generally, during ramping, the initial control signal applied to the amplifier during estimation mode is corrected by integrating an output of the amplifier relative to a second reference signal. The second reference signal is generally proportional to the ramping output of the vector modulator and may be scaled for the desired output power.

In FIG. 1, ramping mode begins by opening switches SW1 and SW2 and configuring the magnitude block 160 to generate a reference signal Vref proportional to the ramping output of the vector modulator. In this configuration, the op-amp 140 is configured as an integrator.

The RC time constant during ramping mode is generally greater than the RC time constant during Estimation Mode. Generally, Ramping Mode lasts longer than Estimation Mode. In one embodiment, the feedback capacitance Cm is equal to Cp and Rm1 is equal to (Rp1+Rp2). The exemplary Ramping Mode RC time constant is approximately 0.7Ts, which is slower than the exemplary RC time constant, 0.2Ts, of the estimation mode. In one embodiment, the ramping mode lasts for approximately 3 to 3.5 Ts.

In one embodiment, during ramping mode, the reference signal and the amplifier output are phase matched by delaying the reference signal applied to the integral control circuit with a delay means 162. The delay means 162 may be a delay circuit or software controlled delay of the signal.

During ramping mode, the reference signal, Vref, increases in proportion to the ramping output of the vector modulator, scaled by whatever the desired output power should be as represented by the time average of the detected amplifier output signal. Ramping mode generally lasts long enough to allow transients to settle out by the end of the ramping mode.

If the reference signal, Vest, during estimation mode is exactly correct and if the peak-detect signal is a perfect representation of the amplifier output power, the reference signal and peak detect output track each other perfectly. Under these circumstances, the inputs at the integrator op-amp 140 are the same throughout the ramping mode (Vref and the peak detect voltage are tracking perfectly and the time constants are the same) and the integrator output voltage remains the same as the estimation output applied to the amplifier control input. The control circuit will correct the amplifier output to the extent that the estimated output is incorrect without inducing transients.

During ramping mode, the transient out-of-band power spectrum is controlled by the bandwidth of the integral control circuit. In one embodiment, the bandwidth of the integral control circuit during ramping mode is reduced relative to the bandwidth of the proportional control circuit during estimation mode. If the ramping mode bandwidth is too low, however, the integral control circuit will not be sufficiently responsive. Thus there is a trade off between transient out of band power spectrum control and integral control circuit responsiveness.

After ramping mode, the control circuit operates in a "Modulation Mode". During modulation mode, the corrected control signal, which may or may not have been corrected during ramping mode depending on the accuracy of the estimation value, applied to the amplifier is maintained by applying a third reference signal to the integral control circuit. The third reference signal is generally proportional to an averaged output of the amplifier.

In one embodiment, in modulation mode, the integral control circuit is configured to have a bandwidth that is less than the bandwidth thereof during ramping mode. In modulation mode, the integral control circuit corrects slow phenomenon such as supply line droop and thermal gain variations, but modulation variations are tracked poorly or at not all.

In the exemplary embodiment of FIG. 1, during modulation mode, the switches SW3 and SW4 are opened. The reference signal Vref generated by the magnitude block 160 and applied to the input of op-amp 140 is based on or proportional to the average peak detector output for the desired amplifier power output. The magnitude block ignores inputs from Vest and from the output of the vector modulator 120. A typical integral gain circuit RC time constant for modulation mode is between approximately 40 and 400 Ts. The switches SW3 and SW4 are controlled by the processor 170.

In some modes of operation, for example TDMA operating modes, modulation ends periodically. In one embodiment, the vector modulator is allowed to ramp down naturally when modulation ends. The relatively slow bandwidth of the integral control circuit in modulation mode will not react to the relatively rapid power reduction. The control circuit may be disabled upon ramping down the vector modulation without spectral considerations.

Figure 3:
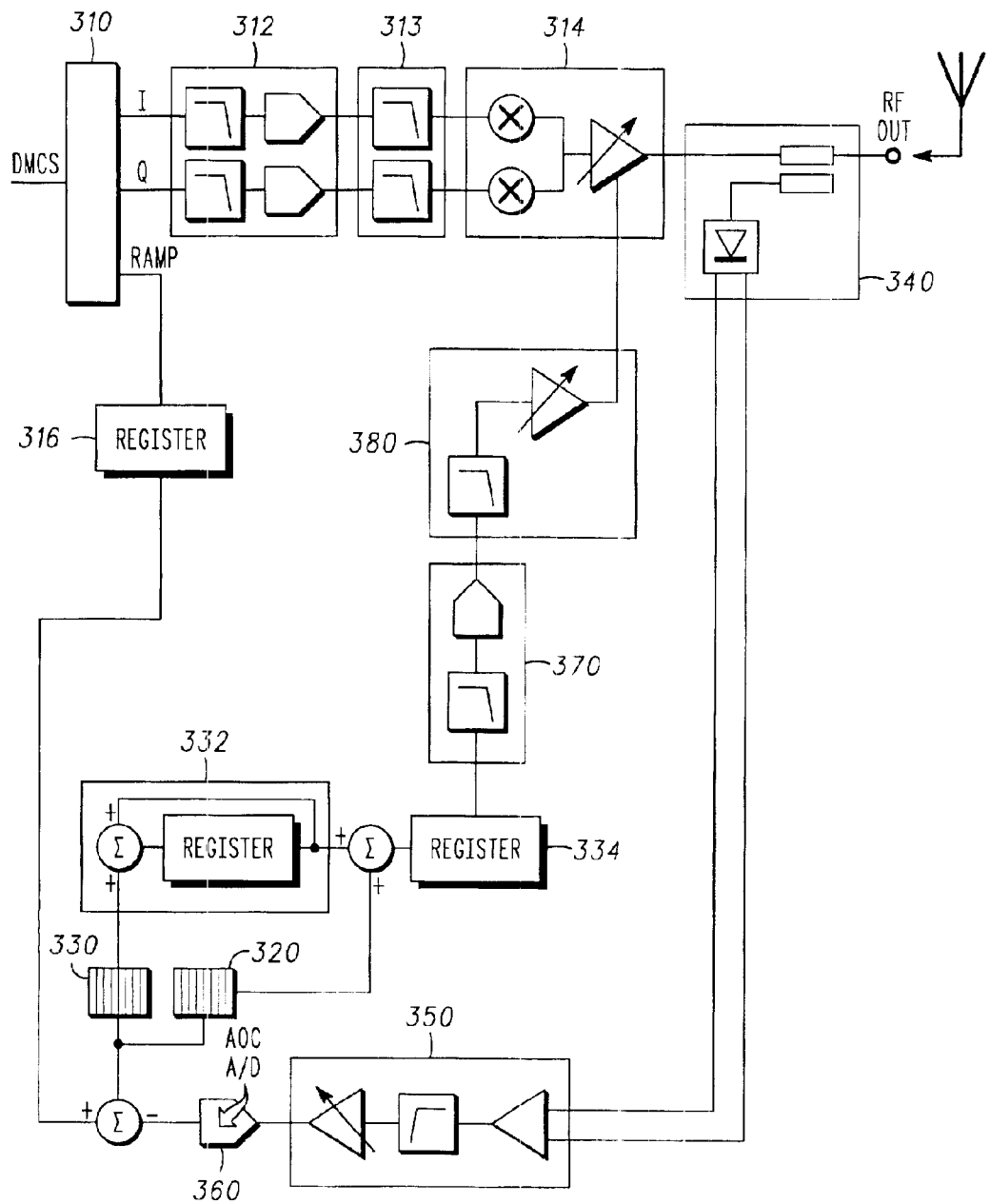
FIG. 3 is an exemplary TDMA transmitter having a digital control circuit.

The amplifier control circuits of the present invention may also be implemented with digital circuit elements. The exemplary embodiment of FIG. 3 is a portion of a mobile TDMA communications device having a transmitter 300 with a digital control system comprising generally an interface 310 that transmits digital vector modulation signals I/Q from a baseband processor to a digital I/Q processing circuit 312 coupled to an amplifier circuit 314 by analog reconstruction filters 313.

A digital proportional control circuit comprising shift registers 320 provides stability. A digital integral control circuit comprises shift registers 330 and accumulator 332. In the digital implementation, during the estimation mode, the initial control signal is loaded directly into the register output of the accumulator. The output of the peak detect circuit 340 is processed with analog processing circuitry 350 and then digitized by an A/D converter 360.

The interface 310 provides digital reference signals via a register 316 from the baseband processor to the proportional control circuit and the integral control circuit. The register 316 delays at least some of the reference signals to the proportional and integral control circuits. The digitized output of the peak detection circuit 340 is summed with the digital reference signals provided by the baseband processor to provide an error signal to the integral control circuit.

The register 334 is not required for the TDMA format and provides a tolerable delay. The outputs of the proportional and integral control circuits are processed and converted by a processing and D/A circuit 370. The resulting analog control signal is processed by an analog processing circuit 380 before coupling to the control input of the amplifier circuit 314.

Figure 4:
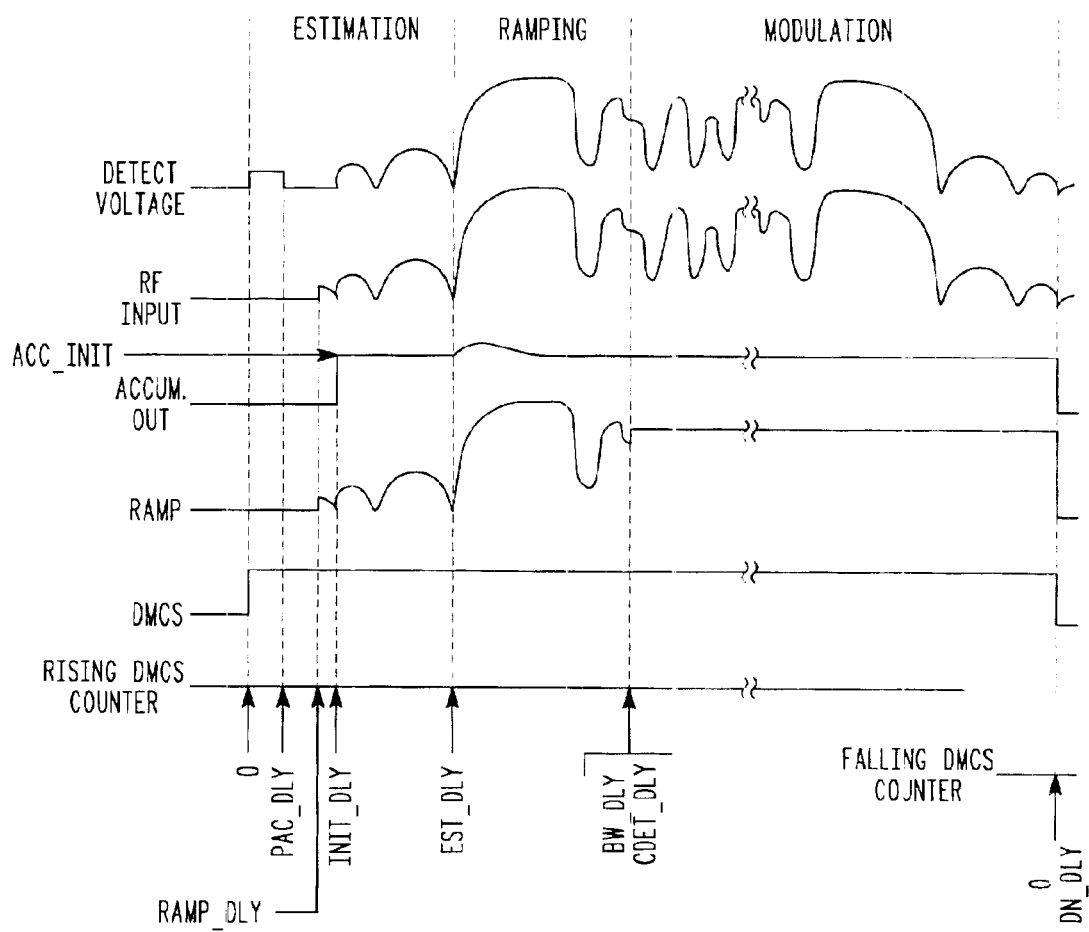
FIG. 4 is a timing signal diagram illustrating TDMA burst operation according to an exemplary embodiment of the invention.

FIG. 4 illustrates a timing diagram for an exemplary IS-136 TDMA application with the operating modes discussed above. TDMA estimation mode operation begins with the rising edge of a DMCS signal. After a delay interval set by PAC_DLY, the detected RF output voltage is reduced by a residual offset. At this point there is no amplifier output. A RAMP_DLY signal is set to align the Ramp waveform with the modulated RF waveform. Next, a delay INIT_DLY sets the point at which the accumulator, and thus the AOC D/A of FIG. 3, are set at the estimated value of ACC_INIT. In FIG. 3, the control output to the amplifier is smoothed by the digital filter on the AOC D/A input 370 and the analog filter 380 on the AOC D/A output and thus does not contain discontinuities shown for the accumulator output. The amplifier output will be proportional to the detected voltage.

After a time interval EST_DLY, the TDMA ramping mode begins and the input to the accumulator is switched to the error between the detected signal and the ramping waveform. During this time, the integral control circuit loop is closed and configured with a first bandwidth setting of ERRGain1. In FIG. 3, the digital filter on the D/A input is bypassed at this time, since it is no longer required for bandwidth control and may compromise loop stability.

In FIG. 3, the value of the output register 334 is stored when CDET_DLY expires at or just before the end of the ramping mode for subsequent TDMA bursts.

TDMA modulation mode begins upon expiration of time interval BW_DLY. The integral control circuit is configured with a bandwidth setting of ERRGain2.

Finally, after the amplifier output falls with I/Q modulation shaping to zero, the DMCS signal goes low to signify the end of the I/Q data. After a delay DN_DLY, the AOC section 370 in FIG. 3 is powered down. This example assumes zero delay, thus DN_DLY is shown as zero. In practice, DMCS will fall prior to DN_DLY expiring.

Figure 5:
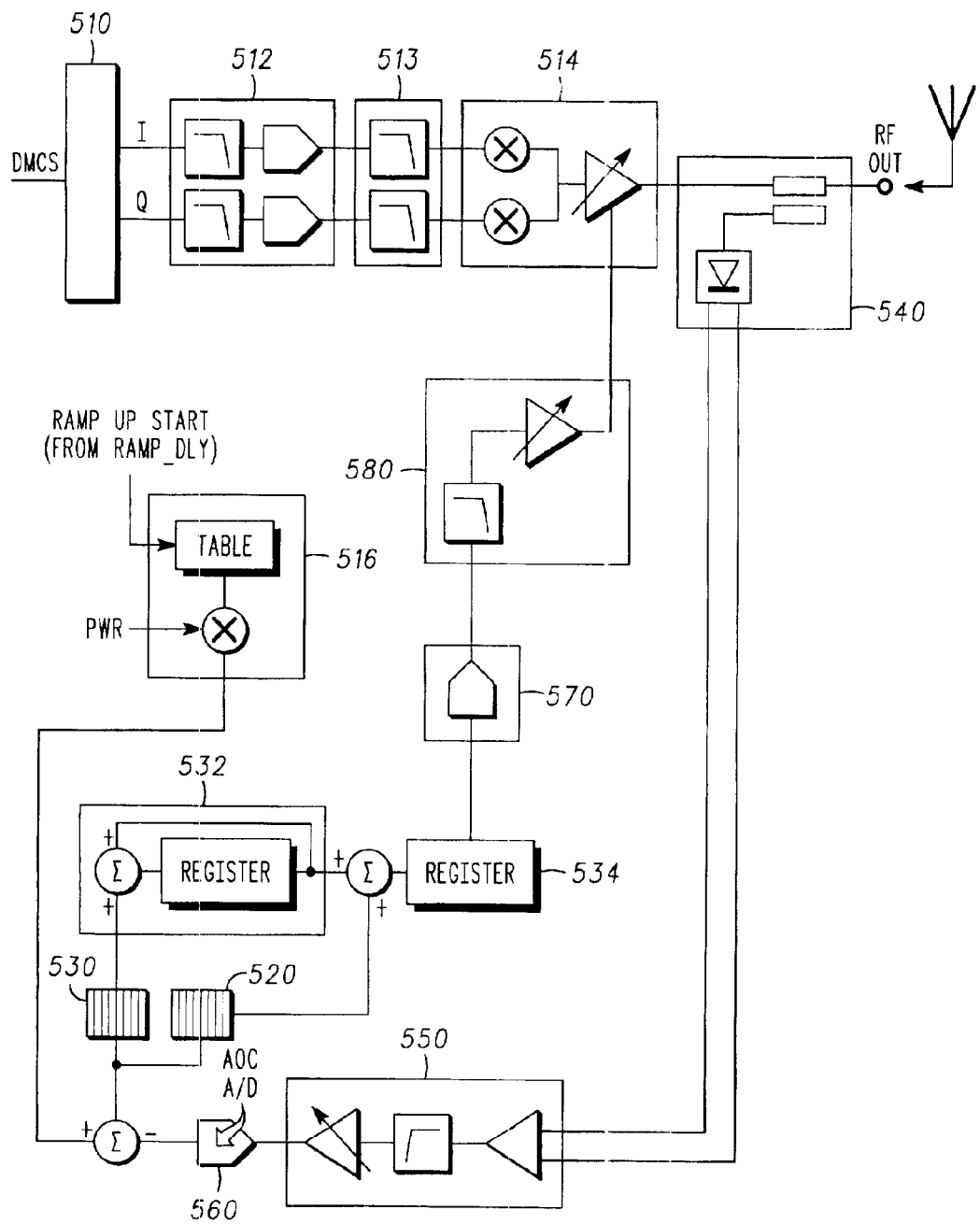
FIG. 5 is an exemplary EDGE transmitter having a digital control circuit.

The exemplary embodiment of FIG. 5 is a portion of a mobile EDGE communications device having a transmitter 500 with a digital control system comprising generally a phase map output 510 that transmits digital vector modulation signals from a baseband processor to a digital I/Q processing circuit 512 to the amplifier circuit 514 via analog reconstruction filters 513.

A digital proportional control circuit comprising shift registers 520 provides stability. A digital integral control circuit comprises shift registers 530 and accumulator 532. In the digital implementation, during the estimation mode, the initial control signal is loaded directly into the register output of the accumulator. The output of the peak detect circuit 540 is processed with analog processing circuitry 550 and then digitized with an A/D converter 560.

In FIG. 5, reference signals are provided to the proportional control circuit and the integral control circuit under control of a baseband processor. The ramping values are stored in a table 516 and are scaled by a factor, PWR, for the desired power output. This is possible because in the EDGE format, the ramping values are not data dependent. Each transmission may thus use the same ramp-up pattern. This eliminates the need to send the ramping values across the digital interface, as was required in the TDMA system of FIG. 3. The digitized output of the peak detection circuit 540 is summed with the digital reference signals provided by the baseband processor to provide an error signal to the integral control circuit.

The digital outputs of the proportional and integral control circuits are converted to analog form by a D/A circuit 570. The resulting analog control signal is also processed by an analog processing circuit 580 before coupling to the control input of the amplifier circuit 514.

Figure 6:
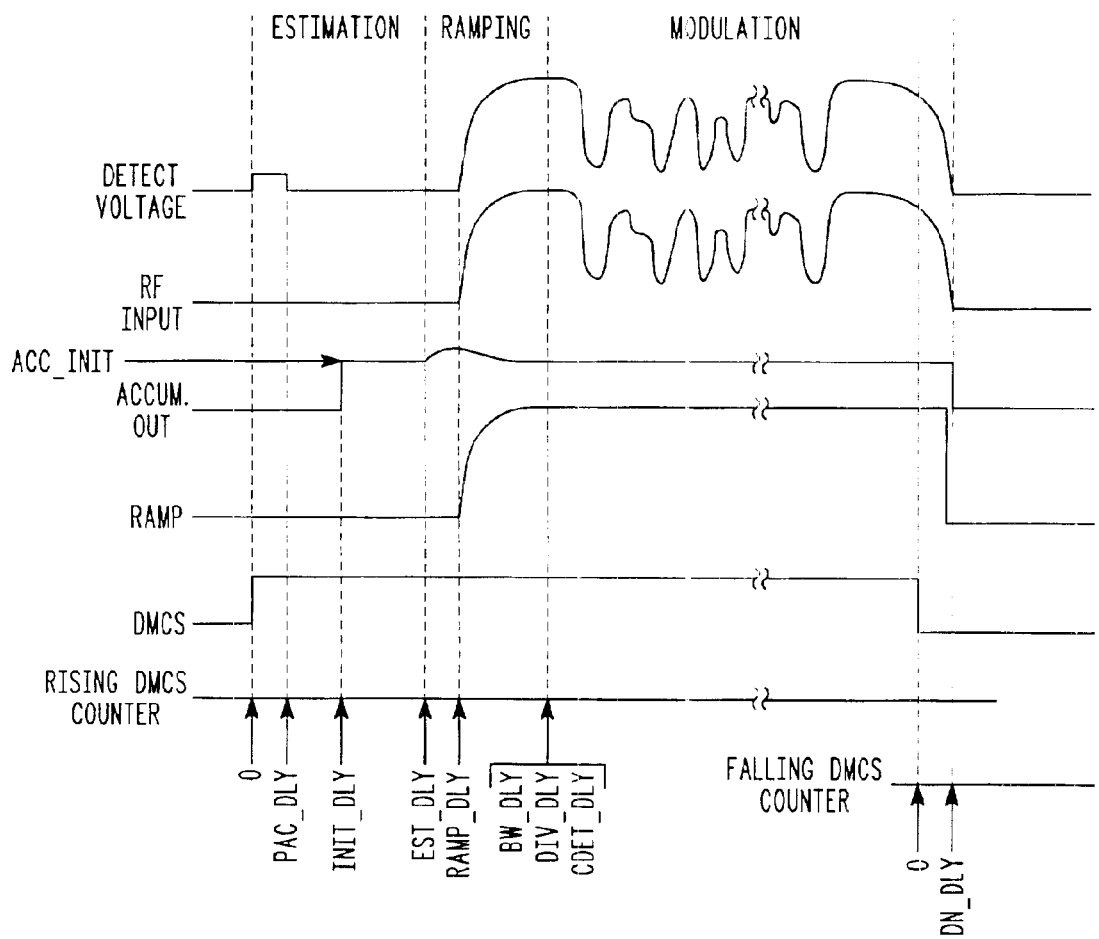
FIG. 6 is a timing signal diagram illustrating EDGE burst operation according to an exemplary embodiment of the invention.

FIG. 6 illustrates a timing diagram for an exemplary EDGE application with the operating modes discussed above. EDGE estimation mode operation begins with the rising edge of a DMCS signal. After a delay interval set by PAC_DLY, the detected RF output voltage is reduced by a residual offset. At this point there is no amplifier output. A RAMP_DLY signal is set to align the Ramp waveform with the modulated RF waveform.

Next, a delay INIT_DLY sets the point at which the accumulator and thus the AOC D/A of FIG. 5 are set at the estimated value of ACC_INIT. In FIG. 5, the control output to the amplifier is smoothed by the analog filter 580 on the AOC D/A output and thus does not contain discontinuities shown for the accumulator output. The amplifier output will be proportional to the detected voltage.

After a time interval EST_DLY, the EDGE ramping mode begins and the input to the accumulator is switched to the error signal between the detected signal and the ramping waveform. After a delay RAMP_DLY to permit suppression of leading low-resolution signals, the Ramp signal begins. During this time, the integral control circuit loop configured with a first bandwidth setting of ERRGain1.

EDGE modulation mode begins upon expiration of time intervals BW_DLY and DIV_DLY. The integral control circuit is configured with a bandwidth setting of ERRGain2, which is generally much lower than the TDMA modulation mode bandwidth. In FIG. 5, the value of the output register 534 is stored when CDET_DLY expires for subsequent bursts.

In another alternative embodiment, an output register 534 is held at the expiration of DIV_DLY. This prevents the AOC control circuit from having a detrimental effect on EDGE modulation fidelity. This is equivalent to setting a low bandwidth with ERRGain2. Finally, after the amplifier output falls with I/Q modulation shaping to zero, the DMCS signal goes low to signify the end of the I/Q data. After a delay set by DN_DLY, the AOC section 570 in FIG. 5 is powered down. This example assumes zero delay.

Figure 7:
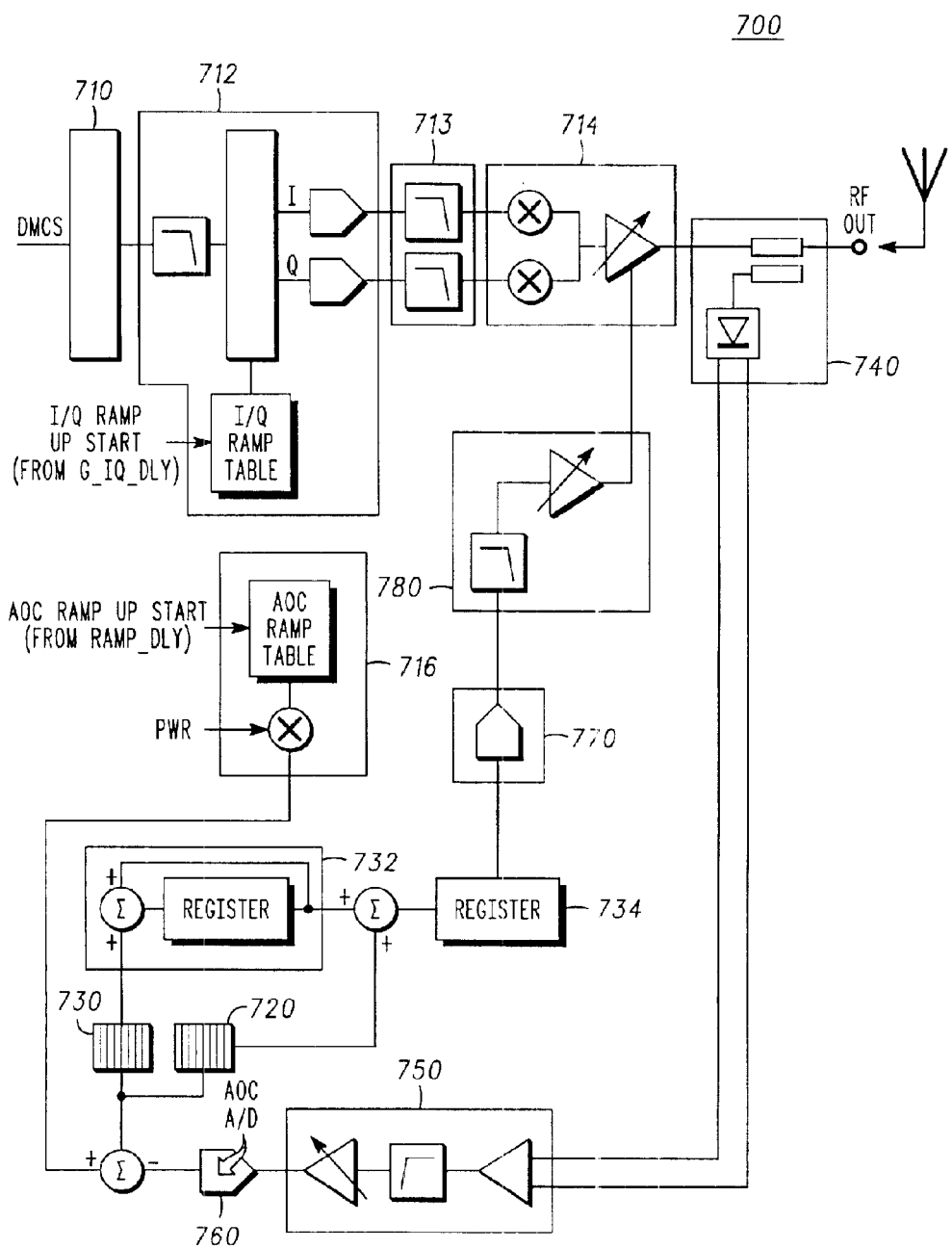
FIG. 7 is an exemplary GSM transmitter having a digital control circuit.

The exemplary embodiment of FIG. 7 is a portion of a mobile GSM communications device having a transmitter 700 with a digital control system comprising generally a differential encoder 710 coupled to a digital I/Q processing circuit 712 coupled to an amplifier circuit 714 via analog I/Q reconstruction filters 713.

In FIG. 7, a digital proportional control circuit comprising shift registers 720 provides stability. A digital integral control circuit comprises shift registers 730 and an accumulator 732. In the digital implementation, during the estimation mode, the initial control signal is loaded directly into the register output of the accumulator. The peak detect circuit 740 output is processed with analog processing circuitry 750 and then digitized with an A/D converter 760.

In FIG. 7, reference signals are provided to the proportional control circuit 720 and the integral control circuit 730 under control of a baseband processor. The ramping values are stored in a table 716 and are scaled by a factor, PWR, for the desired power output. This is possible because in the GSM format, a common ramping pattern is imposed on the modulation for each transmission. This eliminates the need to send the ramping values across the digital interface, as was required in the TDMA implementation of FIG. 3.

The processed and digitized output of the peak detection circuit 740 is summed with the digital reference signals provided by the baseband processor to provide an error signal to the integral control circuit. The register 734 is not required for the GSM format and provides a tolerable delay. The outputs of the proportional and integral control circuits are processed and converted by a processor and D/A circuit 770. The analog control signal is also processed by an analog processing circuit 780 before coupling to the control input of the amplifier circuit 714.

The data, which includes phase information in GSM format, loaded by the circuit 710 and the I/Q Ramp Up signal, which includes amplitude information, are synchronized with each other and with the AOC Ramp Up Start signal so that the summed signals forming the error signal applied to the integral control circuit are phased matched.

Figure 8:
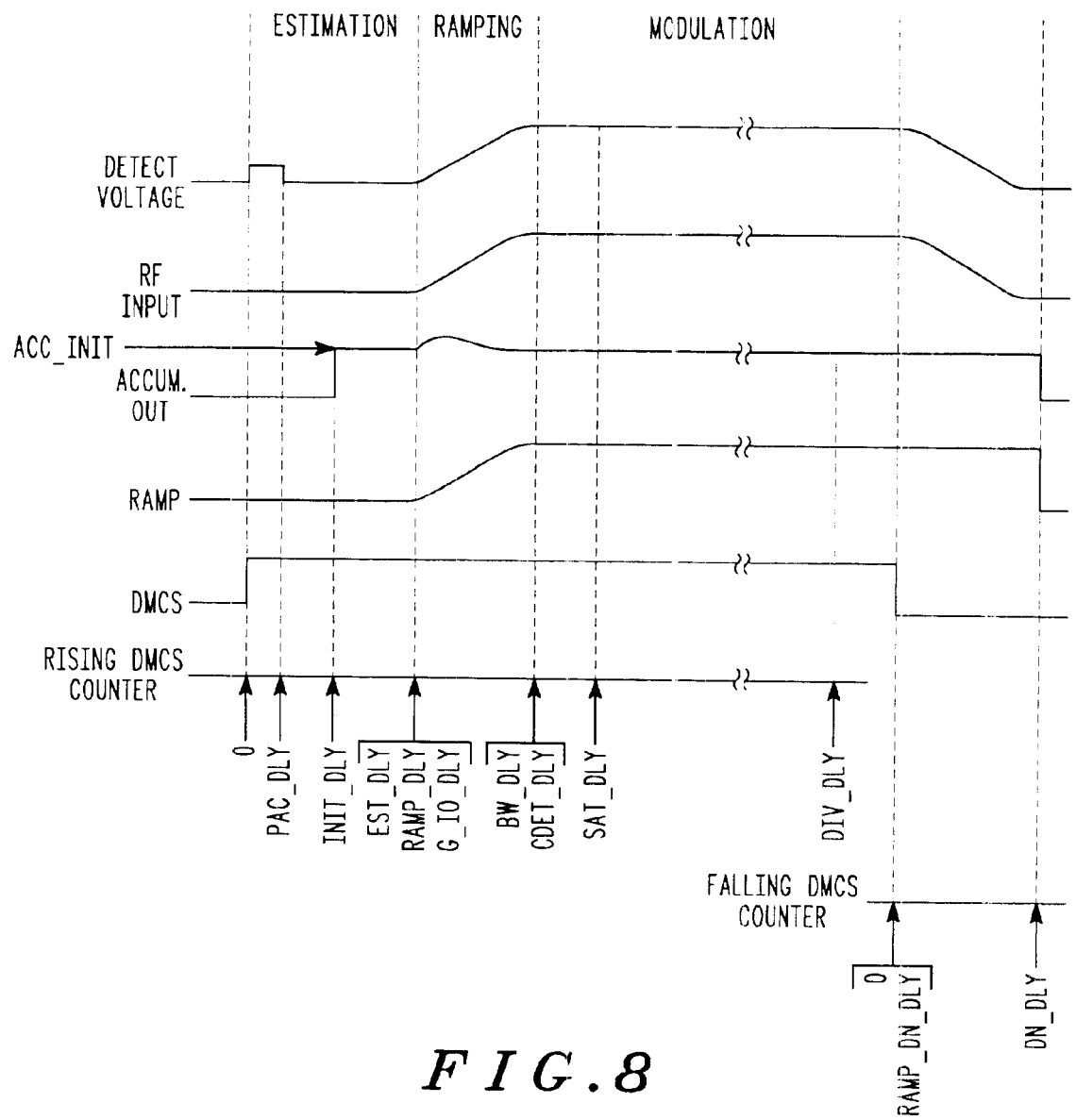
FIG. 8 is a timing signal diagram illustrating GSM burst operation according to an exemplary embodiment of the invention.

FIG. 8 illustrates a timing diagram for an exemplary GSM application with the operating modes discussed above. GSM estimation mode operation begins with the rising edge of a DMCS signal. After a delay interval set by PAC_DLY, the detected RF output voltage is reduced by a residual offset. At this point there is no amplifier output. Next, a delay INIT_DLY sets the point at which the accumulator and thus the AOC D/A of FIG. 8 are set at the estimated value of ACC_INIT.

In FIG. 7, the control output to the amplifier is smoothed by the analog filter 780 on the AOC D/A output and thus does not contain discontinuities shown for the accumulator output. The amplifier output will be proportional to the detected voltage.

After a time interval EST_DLY, the GSM ramping mode begins and the input to the accumulator is switched to the error between the detected signal and the ramping waveform. After a delay RAMP_DLY, the Ramp signal begins. G_IQ_DLY expires at approximately the same time so that RF input rises with the ramping waveform, since both look-up tables are defined by the same function. During this time, the integral control circuit loop is closed and configured with a first bandwidth setting of ERRGain1.

GSM modulation mode begins upon expiration of time interval BW_DLY. The integral control circuit is configured with a bandwidth setting of ERRGain2. The value of the output register is stored when CDET_DLY expires.

Upon expiration of a delay DIV_DLY, the integral control circuit enters a hold mode just before modulation ends. Finally, after the amplifier output falls with the ramp pattern imposed by the I/Q multipliers. The DMCS signal goes low to signify the end of the I/Q data. After a delay set by DN_DLY, the AOC section 770 in FIG. 7 is powered down. RAMP_DN_DLY is shown as zero in the diagram since zero delay is assumed. In practice, it will occur somewhere after the falling edge of the DMCS because of system delays.

While the present inventions and what is considered presently to be the best modes thereof have been described in a manner that establishes possession thereof by the inventors and that enables those of ordinary skill in the art to make and use the inventions, it will be understood and appreciated that there are many equivalents to the exemplary embodiments disclosed herein and that myriad modifications and variations may be made thereto without departing from the scope and spirit of the inventions, which are to be limited not by the exemplary embodiments but by the appended claims.

What is claimed is:

1. An RF amplifier control circuit, comprising:
   an amplifier;
   a vector modulator having an output coupled to an input of the amplifier;
   means for applying an initial control signal to a control input of the amplifier, the initial control signal an estimate of a signal level required at the control input of the amplifier to provide a particular output when the vector modulator output is at full output;
   an integral control circuit having a control signal output coupled to the control input of the amplifier, the integral control circuit having a reference input coupled to a second reference signal source,
   an output of the amplifier coupled to an input of the integral control circuit.

2. The circuit of claim 1, a signal delay means disposed between the second reference signal source and the reference input of the integral control circuit.

3. The circuit of claim 1, a non-linear device interconnecting the output of the amplifier to the input of the integral control circuit.

4. The circuit of claim 1,
   means for ramping the output of the vector modulator coupled to the input of the amplifier upon expiration of a first delay period after applying the initial control signal to the control input of the amplifier;
   the integral control circuit for correcting the initial control signal applied to the amplifier during ramping by integrating the output of the amplifier relative to the second reference signal,
   the second reference signal proportional to the ramping vector modulator output.

5. The circuit of claim 1, means for phase matching the second reference signal and the amplifier output applied to the integral control circuit during ramping.

6. The circuit of claim 4, means for controlling a transient out-of-band power spectrum during ramping.

7. The circuit of claim 4, means for applying a third reference signal to the integral control circuit after ramping, the third reference signal proportional to an average output of the amplifier.

8. The circuit of claim 7, means for preventing the integral control circuit from tracking out the modulation envelope while applying the third reference signal to the integral control circuit.

9. A radio communications device, comprising:
   a transmitter having a vector modulator with an output coupled to an input of an amplifier;

means for applying an initial control signal to a control input of the amplifier before the vector modulator is at full output, the initial control signal an estimated signal level required at the control input of the amplifier to provide a particular output when the vector modulator output is at full output;

means for ramping the output of the vector modulator after applying the initial control signal to the amplifier;

means for correcting the initial control signal applied to the control input of the amplifier during ramping;

means for controlling a transient out-of-band power spectrum during ramping.

10. The radio communications device of claim 9, the means for applying the initial control signal includes an accumulator having a register output coupled to the control input of the amplifier.

11. The radio communications device of claim 10, the means for correcting includes an integral control circuit having a control signal output coupled to the control input of the amplifier, the integral control circuit having a reference input coupled to a second reference signal source.

12. The radio communications device of claim 11, the second reference signal source for applying a second reference signal proportional to the ramping vector modulator output to the reference input of the integral control circuit, means for phase matching the second reference signal and the output from the amplifier applied to the integral control circuit.

13. The radio communications device of claim 12, means for maintaining a corrected control signal applied to the amplifier.

14. The radio communications device of claim 13, the means for maintaining includes means for applying a third reference signal to the integral control circuit after ramping, the third reference signal proportional to an average output of the amplifier, and means for configuring the integral control circuit to have a second bandwidth after ramping, the second bandwidth less than the first bandwidth.

15. A method for a controlling an amplifier in a transmitter, comprising:

applying an initial control signal to the amplifier before a vector modulator signal coupled to an input of the amplifier is at full output;

ramping the vector modulator output coupled to the input of the amplifier after applying the initial control signal;

correcting the initial control signal applied to the amplifier during ramping by integrating an output of the amplifier relative to a second reference signal with an integral control circuit coupled to the control input of the amplifier, the second reference signal proportional to the ramping vector modulator output.

16. The method of claim 15, applying the initial control signal to the amplifier by applying a first reference signal to an accumulator having an output coupled to a control input of the amplifier;

ramping the vector modulator output coupled to the input of the amplifier upon expiration of a first delay period after applying the first reference signal to the accumulator.

17. The method claim 15, controlling a transient out-of-band power spectrum during ramping with a first bandwidth of the integral control circuit.

18. The method of claim 15, maintaining a corrected control signal applied to the amplifier by applying a third reference signal to the integral control circuit after ramping, the third reference signal proportional to an average output of the amplifier.

19. The method of claim 18, configuring the integral control circuit with a second bandwidth after ramping, the second bandwidth less than the first bandwidth.

20. The method of claim 15, coupling the output of the amplifier to the input of the integral control circuit with a non-linear device.

21. The method of claim 15, phase matching the second reference signal and the amplifier output applied to the integral control circuit.

22. The method of claim 21, phase matching the second reference signal and the amplifier output by delaying the second reference signal applied to the integral control circuit.

23. The method of claim 15, generating a new first reference signal by sampling and storing an output of the integral control circuit after ramping.

24. The method of claim 16, obtaining the first reference signal from a look-up table for a particular power output of the amplifier.

* * * * *